United States Patent
Adachi et al.

(10) Patent No.: US 7,868,319 B2
(45) Date of Patent: Jan. 11, 2011

(54) ORGANIC SEMICONDUCTOR DEVICE, DISPLAY USING SAME, AND IMAGER

(75) Inventors: Chihaya Adachi, Hokkaido (JP); Naotoshi Suganuma, Kyoto (JP)

(73) Assignees: Kyoto University, Kyoto (JP); Pioneer Corporation, Tokyo (JP); Rohm Co., Ltd., Kyoto (JP)

( * ) Notice: Subject to any disclaimer, the term of this patent is extended or adjusted under 35 U.S.C. 154(b) by 478 days.

(21) Appl. No.: 10/586,538

(22) PCT Filed: Jan. 20, 2005

(86) PCT No.: PCT/JP2005/001027

§ 371 (c)(1),
(2), (4) Date: Aug. 21, 2008

(87) PCT Pub. No.: WO2005/001027

PCT Pub. Date: Aug. 4, 2005

(65) Prior Publication Data

US 2009/0212281 A1    Aug. 27, 2009

(30) Foreign Application Priority Data

Jan. 21, 2004   (JP) .............................. 2004-013529

(51) Int. Cl.
*H01J 1/62* (2006.01)
(52) U.S. Cl. ................... 257/40; 257/E51.012; 313/504
(58) Field of Classification Search .................. 257/40, 257/57, 72, 347, 794, E51.012, E51.018, 257/80, E51.001, E21.299; 438/108, 197, 438/99; 313/505, 506, 509, 503, 504

See application file for complete search history.

(56) References Cited

U.S. PATENT DOCUMENTS 5,085,946 A    2/1992    Saito et al.

FOREIGN PATENT DOCUMENTS

| JP | 2-291696 | | 12/1990 |
| JP | 05-315078 | | 11/1993 |
| JP | 6-168785 | A | 6/1994 |
| JP | 2003-282256 | A | 10/2003 |
| JP | 2003-282884 | * | 10/2003 |
| JP | 2004-212949 | A | 7/2004 |

* cited by examiner

*Primary Examiner*—Thomas L Dickey
*Assistant Examiner*—Nikolay Yushin
(74) *Attorney, Agent, or Firm*—Rabin & Berdo, P.C.

(57) ABSTRACT

An organic semiconductor device in which recombination of holes and electrons and photoelectric conversion in an organic semiconductor layer are efficiently allowed to occur. The device comprises a bipolar organic semiconductor layer where electrons and holes move, a hole giving/receiving electrode which gives/receives holes to/from the organic semiconductor layer, an electron giving/receiving electrode which is spaced a predetermined distance from the hole giving/receiving electrode and gives/receives electrons to/from the organic semiconductor layer, a hole-side gate electrode which is opposed to a region of the organic semiconductor layer near the hole giving/receiving electrode with an insulating layer between the hole-side gate electrode and the region and serves to control the hole distribution in the organic semiconductor layer, and an electron-side gate electrode which is opposed to the region of the organic semiconductor layer with the insulating layer therebetween and serves to control the electron distribution in the organic semiconductor layer.

6 Claims, 5 Drawing Sheets

ORGANIC SEMICONDUCTOR DEVICE, DISPLAY USING SAME, AND IMAGER

TECHNICAL FIELD

The present invention relates to an organic semiconductor device that comprises an organic semiconductor layer and a pair of electrodes that gives/receives holes and electrons to/from the organic semiconductor layer respectively, and a display and an imager using the same.

BACKGROUND ART

An organic EL (electroluminescence) device, a typical example of an organic semiconductor device, is a light emitting element which utilizes a luminous phenomenon during recombination of electrons and holes in an organic semiconductor layer. More specifically, the organic EL device comprises an organic semiconductor light emitting layer, an electron injecting electrode for injecting electrons to the organic semiconductor light emitting layer, and a hole injecting electrode for injecting holes to the organic semiconductor light emitting layer (refer to Japanese Unexamined Patent Publication No. 05-315078 (1993)).

To improve the light emitting efficiency, the number of carriers (electrons and holes) to be injected in the organic semiconductor layer must be appropriately balanced. To that end, the combination of respective materials of the organic semiconductor layer, the hole injecting electrodes, and the electron injecting electrodes must be properly selected, and further, the hole injecting electrodes and the electron injecting electrodes must be positioned properly. In practice, however, the proper selection of the materials still remains difficult.

Alternatively, organic semiconductor layers may be used as a photosensitive layer to configure an optical sensor. The photosensitive layer has the function of photoelectric conversion, which generates pairs of electrons and holes through external light irradiation. In this case, too, in order to gain desired sensitivity, combination of respective materials of the organic semiconductor layer and the pair of electrodes must be properly selected and their location must be appropriately arranged. However, it is difficult to design a configuration of desired characteristics.

Further, in the cases mentioned above, neither the device that emits light nor the device that detects light can change the light emitting/receiving characteristics. Devices should thus be individually designed for specific applications.

SUMMARY OF THE INVENTION

It is an object of the present invention to provide an organic semiconductor device which effectively allows electron-hole recombination or photoelectric conversion in organic semiconductor.

It is another object of the present invention to provide an organic semiconductor device which is capable of changing the characteristics and attaining greater versatility.

It is still another object of the present invention to provide a display using such organic semiconductor device.

It is a still further object of the present invention to provide an imager using such organic semiconductor device.

In order to attain the above objects, the organic semiconductor device of the present invention comprises: a bipolar organic semiconductor layer in which electrons and holes can move; a hole giving/receiving electrode for giving/receiving holes to/from the organic semiconductor layer; an electron giving/receiving electrode spaced a predetermined distance from the hole giving/receiving electrode for giving/receiving electrons to/from the organic semiconductor layer; a hole-side gate electrode arranged opposing to a region of the organic semiconductor layer near the hole giving/receiving electrode with an insulating layer sandwiched for controlling distribution of holes in the organic semiconductor layer; and an electron-side gate electrode opposing to a region of the organic semiconductor layer near the electron giving/receiving electrode with an insulating layer sandwiched for controlling distribution of electrons in the organic semiconductor layer.

More specifically, the hole giving/receiving electrode may be a hole injecting electrode that injects holes on the organic semiconductor layer, and the electron giving/receiving electrode may be an electron injecting electrode that injects electrons on the organic semiconductor layer.

With this arrangement, application of a control voltage to the hole-side gate electrode allows control of injection of holes from the hole injecting electrode to the organic semiconductor layer. Similarly, application of a control voltage to the electron-side gate electrode allows control of injection of electrons from the electron injecting electrode to the organic semiconductor layer. Consequently, potentials in the hole-side and electron-side gate electrodes can be controlled separately, and thus the balance of carriers to be injected to the organic semiconductor layer can be adjusted easily, recombining the carriers in the organic semiconductor layer effectively.

Additionally, in the organic semiconductor layer, formation of channels can be controlled separately in a region opposed to the hole-side gate electrode and in a region opposed to the electron-side gate electrode. Therefore, for example, a channel connected to the hole injecting electrode for supplying holes and a channel connected to the electron injecting electrode for supplying electrons, may be arranged at a midpoint between the hole injecting electrode and the electron injecting electrode to allow the channels to pinch off separately. This increases significantly the number of holes and electrons at the midpoint between the hole injecting electrode and the electron injecting electrode, resulting in more effective recombination of holes and electrons.

Further, as the applied voltages to the hole-side gate electrode and the electron-side gate electrode are controlled separately, it enables to change their characteristics readily, and thus organic semiconductor devices with greater versatility can be realized.

The organic semiconductor layer may be an organic semiconductor light emitting layer that emits light through recombination of electrons and holes in the layer.

With this arrangement, the organic semiconductor layer, which is a light emitting layer, can recombine carriers effectively, achieving highly efficient luminescent behavior. In addition, as the applied voltages to the hole-side gate electrode and the electron-side gate electrode are controlled separately, it enables to change their characteristics readily, and can thus attain organic semiconductor devices with greater versatility.

For example, when one of the hole-side and electron-side gate electrodes is applied with a fixed amount of a control voltage and at the same time the other electrode is applied with changing amount of a control voltage, it makes possible of on/off control of light emission, as well as light emission with gradation by adjusting the intensity thereof. As a matter of course, if the control voltages applied respectively on the both gate electrodes are adjusted individually by changing the voltages of individual electrode into two or more levels, more gradation during light emission can be realized.

It is preferable that the organic semiconductor device further comprises a control circuit that independently applies control voltages to the hole-side gate electrode and electron-side gate electrode, respectively.

With this arrangement, control voltages can be independently applied to both the hole-side and electron-side gate electrodes, so that carriers in the organic semiconductor layer can be balanced appropriately and the shapes of channels in the hole- and electron-injecting electrodes can be separately controlled.

Such organic semiconductor device may be one-dimensionally or two-dimensionally disposed on a substrate to configure a one-dimensional or two-dimensional display device with each pixel constituted of an organic semiconductor device. Since each pixel exhibits high efficiency, a low power drive display or a high intensity display can be realized.

The organic semiconductor layer may be an organic semiconductor photo-sensitive layer that generates pairs of electrons and holes through external irradiation of light.

With this arrangement, irradiation of light on the organic semiconductor layer generates pairs of electrons and holes. In other words, photoelectric conversion occurs in the organic semiconductor layer. The electron-side and hole-side gate electrodes, when applied with appropriate control voltages, effectively guide electrons and holes to the electron and holes giving/receiving electrodes respectively, thus achieving highly efficient photoelectric conversion.

In addition, adjusting the amount of the control voltages applied to these electrodes can control the photoelectric conversion efficiency, and further adjust the sensitivity, thus achieving a light detecting device with high versatility.

Such light detecting device may be used as a detector pixel by disposing the light detecting device one-dimensionally or two-dimensionally on a substrate to configure an imager.

The organic semiconductor layer may comprise a bipolar organic semiconductor material, in which both electrons and holes can move, and which may include:
α-NPD, Alq3, BSA-1m(9,10-Bis(3-cyanostilil)anthracene),
MEHPPV(Poly[2-Methoxy-5-(2-ethylhexyloxy)-1,4-phenylenevinylene]),
CN-PPP(Poly[2-(6-cyano-6-methylheptyloxy)-1,4-phenylene]),
Bis(2-(2-hydroxyphenyl)-benz-1,3-thiazolato)zinc complex,
Poly[(9,9-dihexylfluoren-2,7-diyl)-co-(anthracen-9,10-diyl)].

In the organic semiconductor layer formed of such bipolar organic semiconductor materials, both electrons and holes exhibit excellent mobility, and the electrons and holes thus effectively recombine and generate pairs thereof.

The organic semiconductor layer may be a laminated structural film with an N-type organic semiconductor layer and a P-type organic semiconductor layer laminated with each other. The N-type organic semiconductor layer is a layer formed of an N-type organic semiconductor material and the P-type organic semiconductor layer is a layer formed of a P-type organic semiconductor material. At the boundary between the N-type organic semiconductor layer and the P-type organic semiconductor layer, a PN junction will be formed, where electrons and holes are recombined or their pairs are generated.

Further, the organic semiconductor layer may have a junction film arrangement comprising an N-type organic semiconductor layer and a P-type organic semiconductor layer having a junction disposed between the hole giving/receiving electrode and the electron giving/receiving electrode. With this arrangement, the PN junction, formed between the hole giving/receiving electrode and the electron giving/receiving electrode, makes it possible to effectively recombine electrons and holes or generate pairs thereof.

Further, the organic semiconductor layer may comprise a mixture of an N-type organic semiconductor material and a P-type organic semiconductor material. In this configuration, since a mixture of the N-type organic semiconductor material and the P-type organic semiconductor material configures a bipolar organic semiconductor layer, in which electrons and holes exhibit excellent mobility, it makes possible effectively recombining the electrons and the holes and generating pairs thereof.

The N-type organic semiconductor material may include: $C_6$-PTC, $C_8$-PTC, $C_{12}$-PTC, $C_{13}$-PTC, Bu-PTC, $F_7$Bu-PTC*, Ph-PTC, $F_5$Ph-PTC*, PTCBI, PTCDI, TCNQ, and $C_{60}$ fullerene. Additionally, NTC materials such as $C_6$-NTC, $C_8$-NTC, $F_{15}$octyl-NTC, $F_3$MeBn-NTC can be applied.

Likewise, the P-type organic semiconductor material may include: Pentacene, Tetracene, Anthracene, Phthalocyanine, α-Sexithiophene, α,ω-Dihexyl-sexithiophene, Oligophenylene, Oligophenylenevinilene, Dihexyl-Anthradithiophene, Bis(dithienothiophene), Poly(3-hexylthiophene), Poly(3-butylthiophene), Poly(phenylenevinilene), Poly(thienylenevinilene), Polyacetylene, α,ω-Dihexyl-quinquethiophene, TPD, α-NPD, m-MTDATA, TPAC, TCTA, and Poly(vinylcarbazole).

Aforementioned and further objects, features, and advantages of the present invention will become apparent from the following description of embodiments by reference to the appended drawings.

BEST MODES FOR CARRYING OUT THE INVENTION

Figure 1:
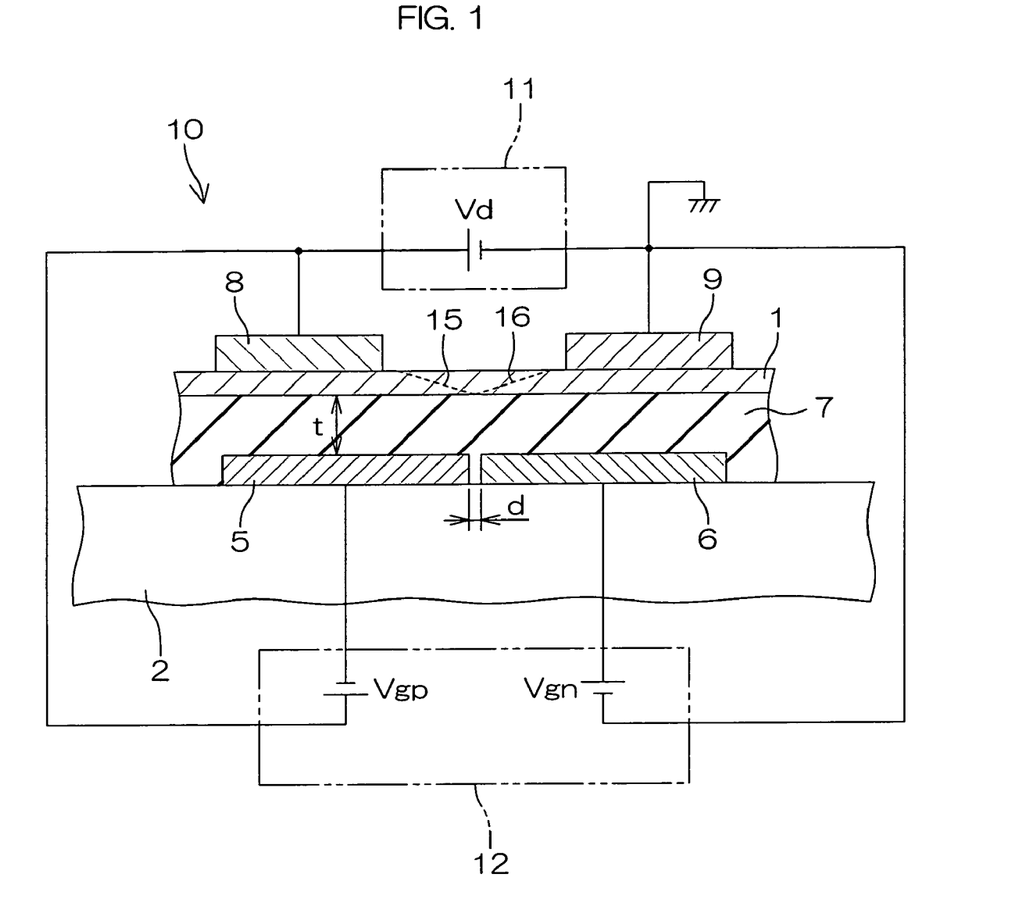
FIG. 1 is a schematic sectional view for describing an arrangement of an organic semiconductor device according to one embodiment of the present invention.

FIG. 1 is a schematic sectional view for describing an arrangement of an organic semiconductor device according to one embodiment of the present invention. The organic semiconductor device 10 is an organic light emitting element (organic electroluminescence (EL) element) that recombines electrons and holes in an organic semiconductor layer 1 (organic semiconductor light emitting layer) to emit light. The organic semiconductor 10 comprises: a hole-side gate electrode 5 and an electron-side gate electrode 6 formed as being spaced apart from each other on a substrate 2; a gate insulating film 7 (insulating layer) formed as to cover the gate electrodes 5 and 6; the organic semiconductor layer 1 laminated on the gate insulating layer 7; a hole injecting electrode 8 (hole giving/receiving electrode) and an electron injecting electrode 9 (electron giving/receiving electrode) formed apart from each other on the organic semiconductor 1. In other words, on one side of the organic semiconductor layer 1, the hole injecting electrode 8 and the electron injecting electrode 9 are disposed apart from each other. On the other side of the organic semiconductor layer 1, the hole-side gate electrode 5 and the electron-side gate electrode 6 are disposed as opposing respectively to the hole injecting electrode 8 and the electron injecting electrode 9. Between the layer 1 and the gate electrodes 5 and 6, the gate insulating layer 7 is interposed. The organic semiconductor layer 1 is configured with a bipolar organic semiconductor material, in which both electrons and holes exhibit high mobility.

The hole-side gate electrode 5 is formed in a region near the hole injecting electrode 8, and the electron-side gate electrode 6 is formed in a region near the electron injecting electrode 9. More specifically, the hole-side gate electrode 5 is formed in a region near the hole injecting electrode 8 between the hole injecting electrode 8 and the electron injecting electrode 9, and extends toward the electron injecting electrode 9 from a region opposed to the hole injecting electrode 8. Likewise, the electron-side gate electrode 6 is formed in a region near the electron injecting electrode 9 between the hole injecting electrode 8 and the electron injecting electrode 9, and extends toward the hole injecting electrode 8 from a region opposed to the electron injecting electrode 9.

The hole-side gate electrode 5 can apply an electric field through a gate insulating layer 7 to a region to which the hole-side gate electrode 5 opposes in the organic semiconductor layer 1, and thus can control the distribution of the carriers in this region. Likewise, the electron-side gate electrode 6 can apply an electric field through the gate insulating layer 7 to a region to which the electron-side gate electrode 6 opposes in the organic semiconductor layer 1, and thus can control the distribution of the carriers in this region.

A bias voltage applying circuit 11 applies a bias voltage Vd across the hole injecting electrode 8 and the electron injecting electrode 9. In this circuit, the hole injecting electrode 8 is connected to the positive terminal and the electron injecting electrode 9 is connected to the negative terminal.

In addition, a gate controlling circuit 12 separately applies control voltages to the hole-side gate electrode 5 and the electron-side gate electrode 6. More specifically, the gate controlling circuit 12 applies a control voltage, which is lower than a control voltage applied to the hole injecting electrode 8 by $V_{gp}$, to the hole-side gate electrode 5, and the circuit 12 applies a control voltage, which is higher than a control voltage applied to the electron injecting electrode 9 by $V_{gn}$, to electron-side gate electrode 6. That is, the potential of electron injecting electrode 9 is $-Vd$, the potential of the hole-side gate electrode 5 is $-V_{gp}$, and the potential of electron-side gate electrode 6 is $V_{gn}-Vd$, where the electric potential of the hole injecting electrode 8 is $V_s=0$. The differences of potential level among them allow the hole injecting electrode 8 to inject holes and the electron injecting electrode 9 to inject electrons into the organic semiconductor layer 1.

Appropriately setting the control voltages $V_{gp}$ and $V_{gn}$, applied to the hole-side gate electrode 5 and the electron-side gate electrode 6 respectively, allows both a hole-side channel 15 that extends from the hole injecting electrode 8 toward the electron injecting electrode 9, and a electron-side channel 16 that extends from the electron injecting electrode 9 toward the hole injecting electrode 8, to pinch-off near a central region between the hole injecting electrode 8 and the electron injecting electrode 9. In the neighboring region where the pinch-off occurs, the hole-side channel 15 exhibits a high hole density and the electron-side channel 16 exhibits a high electron density. As a result, at the point where pinch off occurs, highly effective recombination of electrons and holes, and further, high-intensity light emission can be achieved.

Moreover, for example, when the control voltage $V_{gp}$ to be applied to the hole-side gate electrode 5 (one of the gate electrodes) is fixed to a constant value (for example, a value at which the hole-side channel is pinched off at the central region between the hole injecting electrode 8 and the electron injecting electrode 9), while the control voltage $V_{gn}$ to be applied to the electron-side gate electrode 6 (the other of the gate electrodes) is changed, then the efficiency of the recombination of electrons and holes can be changed. Changing the efficiency of recombination can change the luminance level in a stepwise manner or without steps, permitting on/off display (two-step gradation display) and three- or more step gradation display. As a matter of course, similar light emitting behavior can also be attained by fixing the control voltage applied to the electron-side gate electrode 6 at a constant value while the control voltage applied to the hole-side gate electrode 5 is changed. In addition, when the control voltages applied to the hole-side gate electrode 5 and electron-side gate electrode 6 are individually changed in a stepwise manner or without steps, display with more gradation levels can be realized.

The hole injecting electrode 8 and the electron injecting electrode 9 may respectively use materials that can easily inject holes and electrons respectively to the organic semiconductor layer 1. For example, materials appropriately selected from Mg—Ag alloy, Li—Al alloy, Ca, Pt, Au, ITO (solid solution of indium oxide ($In_2O_3$) and tin oxide ($SnO_2$)) and the like may be used.

It is preferable that the distance d between the hole-side gate electrode 5 and the electron-side gate electrode 6 is equal to or several times larger than the thickness t of the gate insulating layer 7. (In the accompanying drawings, however for convenience, the thickness t is shown larger than the distance d). The thickness t of the gate insulating layer 7 may be set to several tens nanometers to several hundreds nanometers depending upon the threshold voltage during the light emitting operation.

The hole-side gate electrode 5 and the electron-side gate electrode 6 may use materials such as polysilicon (highly concentrated impurities doped to obtain a lower resistivity), Ni, Al, and ITO.

Bipolar organic semiconductor materials configuring organic semiconductor layer 1 may be selected from the materials described in "Summary of the Invention". Alternatively, instead of using such bipolar organic semiconductor materials, a mixture of an N-type organic semiconductor material and a P-type organic semiconductor material may be used to configure the organic semiconductor layer 1. The N-type and P-type organic semiconductor materials can be selected from the materials described in "Summary of the Invention".

The substrate 2 may use silicon substrate, silicon substrate with a silicon oxide layer formed thereon, silicon nitride substrate, glass substrate, sapphire substrate or the like.

The gate insulating layer 7 may use silicon oxide, tantalum pentoxide, aluminum oxide, polymer (such as novolac resin, polyimide) or the like.

Figure 2A:
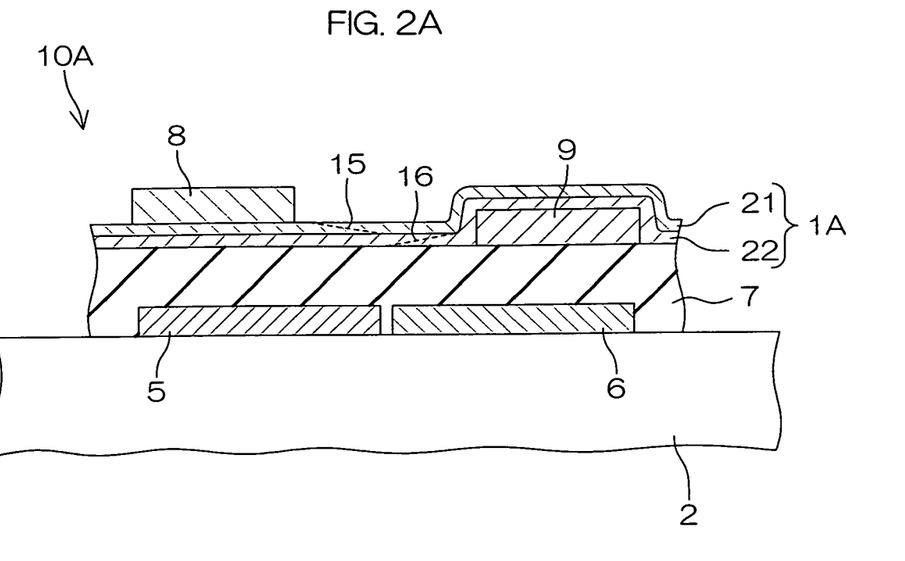
FIGS. 2A and 2B are a schematic sectional views for describing arrangements of organic semiconductor devices according to other embodiments of the present invention.
Figure 2B:
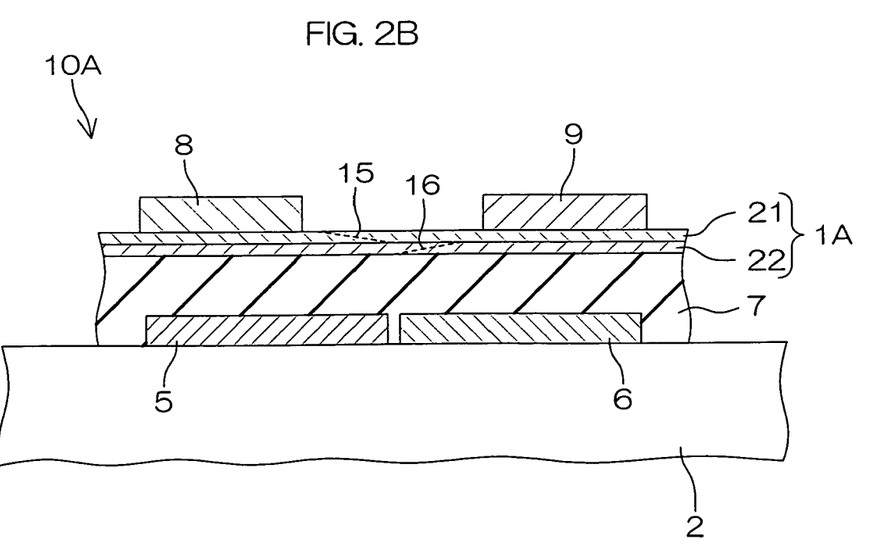

FIGS. 2A and 2B illustrate cross-sectional views of the arrangement of organic semiconductor devices in accordance with other embodiments of the present invention. In FIGS. 2A and 2B, each element corresponding to the element shown in FIG. 1 will be given an identical reference numeral in FIG. 1. In an organic semiconductor device 10A, an organic semiconductor layer 1A comprises a laminated structural film having a P-type organic semiconductor layer 21 and an N-type organic semiconductor layer 22.

In the arrangement of FIG. 2A, the N-type organic semiconductor layer 22 is formed such that it covers the gate insulating layer 7 and the electron injecting the electrode 9 (in contact with the electron injecting the electrode 9). The P-type organic semiconductor layer 21 is then formed such that it covers the N-type organic semiconductor layer 22. On the P-type organic semiconductor layer 21, the hole injecting electrode 8 is formed such that it contacts with the P-type organic semiconductor layer 21.

In the arrangement of FIG. 2B, on the gate insulating layer 7, the N-type organic semiconductor layer 22 and the P-type organic semiconductor layer 21 are laminated in this order. On the upper layer, that is, the P-type organic semiconductor layer 21, both the hole injecting electrode 8 and the electron injecting electrode 9 are disposed. That is, the hole injecting electrode 8 contacts the P-type organic semiconductor layer 21 while the electron injecting electrode 9 does not contact the N-type organic semiconductor layer 22. Even under this condition, the electron injecting electrode 9 can give/receive carriers (electrons, in this case) to/from the N-type organic semiconductor layer 22 through the P-type organic semiconductor layer 21.

In the arrangement shown in FIG. 2A, the P-type organic semiconductor layer 21 and the N-type organic semiconductor layer 22 may change their positions with respect to each other. In this case, the electron injecting electrode 9 contacts the N-type organic semiconductor layer 22 while the hole injecting electrode 8 does not contact the P-type organic semiconductor layer 21. In this arrangement, the hole injecting electrode 8 can give/receive carriers (holes, in this case) to/from the P-type organic semiconductor layer 21 through the N-type organic semiconductor layer 22.

The P-type organic semiconductor material that forms the P-type organic semiconductor layer 21 is characterized in high mobility of holes and low mobility of electrons. The N-type organic semiconductor material that forms N-type organic semiconductor layer 22 is characterized in low mobility of holes and high mobility of electrons. As a whole, the organic semiconductor layer 1A comprising a laminated structural film having the P-type organic semiconductor layer 21 and the N-type organic semiconductor layer 22 forms a bipolar thin film.

Holes injected from the hole injecting electrode 8 travel toward the electron injecting electrode 9 through the P-type organic semiconductor layer 21, and electrons injected from the electron injecting electrode 9 travel toward the hole injecting electrode 8 through the N-type organic semiconductor 22. Then the electrons and holes recombine to emit light at the PN junction, the boundary between the P-type organic semiconductor layer 21 and the N-type organic semiconductor layer 22, in a region between the hole injecting electrode 8 and electron injecting electrode 9.

A hole-side channel 15 is formed in the P-type organic semiconductor layer 21 and an electron-side channel 16 is formed in the N-type organic semiconductor layer 22. As with the embodiment shown in FIG. 1, by appropriately setting the control voltages applied respectively to the hole-side gate electrode 5 and electron-side gate electrode 6, the channels 15 and 16 can be pinched off at a central region between the hole injecting electrode 8 and the electron injecting electrode 9, and thus enables highly effective recombination of electrons and holes, as well as high-intensity light emission.

Also as with the embodiment shown in FIG. 1, light emitting operation with multiple-level gradation can be performed by adjusting control voltages. For example, the control voltage applied to one of the hole-side gate electrode 5 and the electron-side gate electrode 6 is fixed while the control voltage applied to the other of the electrodes is adjusted, or, both the control voltages can be adjusted together.

The P-type and N-type organic semiconductor materials can be respectively selected from the materials described in "Summary of the Invention".

In general, by laminating a P-type material layer and an N-type material layer that exhibit transistor characteristics in a single-layer, a bipolar drive can be realized. However, in this case, since the irregularities or roughness on the surface of the material used in the lower layer (layer 22 shown in FIGS. 2A and 2B) adversely affects the mobility of holes or electrons of the upper layer (layer 21 shown in FIGS. 2A and 2B), it is preferable that materials used in the lower layer should be a thin film with a smooth surface or a highly amorphous thin film, with high mobility. As an example, polymer TFT such as poly (3-hexylthiophene) can be one of useful materials for the lower layer. Contrastingly, it is preferable that a material for upper layer exhibits high mobility even when the lower layer has a surface with irregularities or roughness. As an example, N-type materials having perylene rings such as PTCBI and PTCDI exhibit high mobility even when they are stacked on a highly rough layer.

Figure 3:
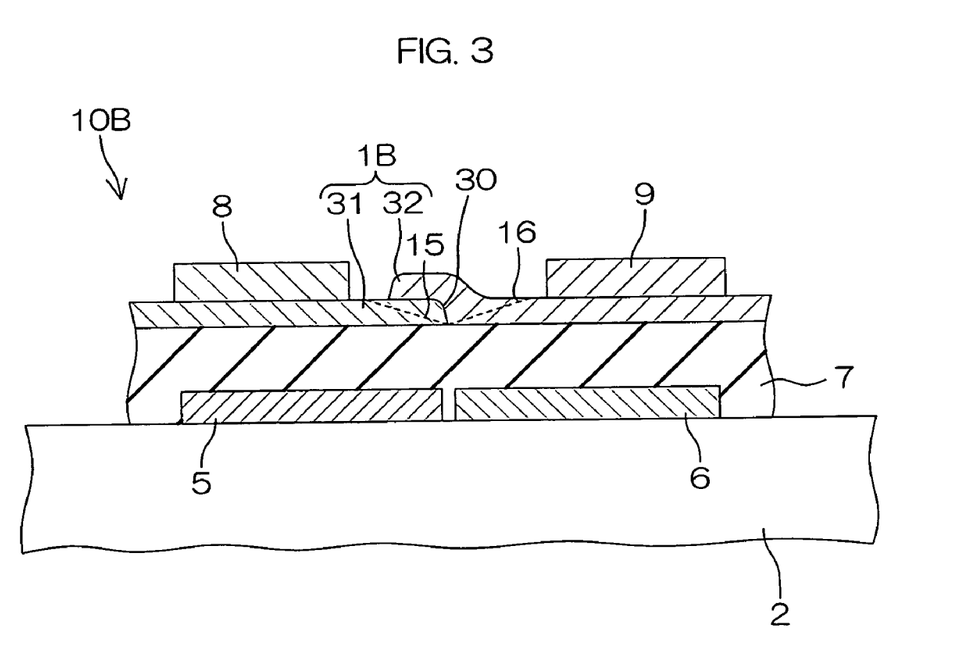
FIG. 3 is a schematic sectional view for describing an arrangement of an organic semiconductor device according to further another embodiment of the present invention.

FIG. 3 is a schematic sectional view for describing an arrangement of an organic semiconductor device according to further another embodiment of the present invention. In FIG. 3, each element corresponding to the element shown in FIG. 1 will be given identical reference numeral in FIG. 1. An organic semiconductor device 1B in this embodiment has a junction layer arrangement, in which a P-type organic semiconductor layer 31 and an N-type organic semiconductor layer 32 have a junction 30 at a portion between the hole injecting electrode 8 and the electron injecting electrode 9. Preferably, the portion is substantially at the center between the electrodes.

On the gate insulating layer 7, the P-type organic semiconductor layer 31 covers a region opposed to the hole-side gate electrode 5 and extends toward near a central portion between the hole injecting electrode 8 and the electron injecting electrode 9. On the P-type organic semiconductor layer 31, the hole injecting electrode 8 is formed so as to contact the P-type organic semiconductor layer 31.

On the gate insulating layer 7, the N-type organic semiconductor layer 32 covers a region opposed to the electron-side gate electrode 6 and extends toward near a central portion between the hole injecting electrode 8 and the electron injecting electrode 9 to form the junction 30 between the P-type organic semiconductor layer 31 and itself. In this embodiment, however, the N-type organic semiconductor layer 32 is formed such that it extends beyond the junction 30 to further reach a region that covers a part of the P-type organic semiconductor layer 31. This is because the N-type organic semiconductor layer 32 is formed larger to ensure the formation of the junction 30. On the N-type organic semiconductor layer 32, the electron injecting electrode 9 is formed so that it contacts the N-type organic semiconductor layer 32.

In the embodiment, as with the embodiments shown in FIGS. 2A and 2B, a similar operation can also be performed to effectively recombine electrons and holes at the junction 30.

Likewise the embodiments shown in FIGS. 2A and 2B, P-type organic semiconductor materials for the P-type organic semiconductor layer 31 and N-type organic semiconductor materials for the N-type organic semiconductor layer 32 may be selected from the materials described in "Summary of the Invention".

Figure 4:
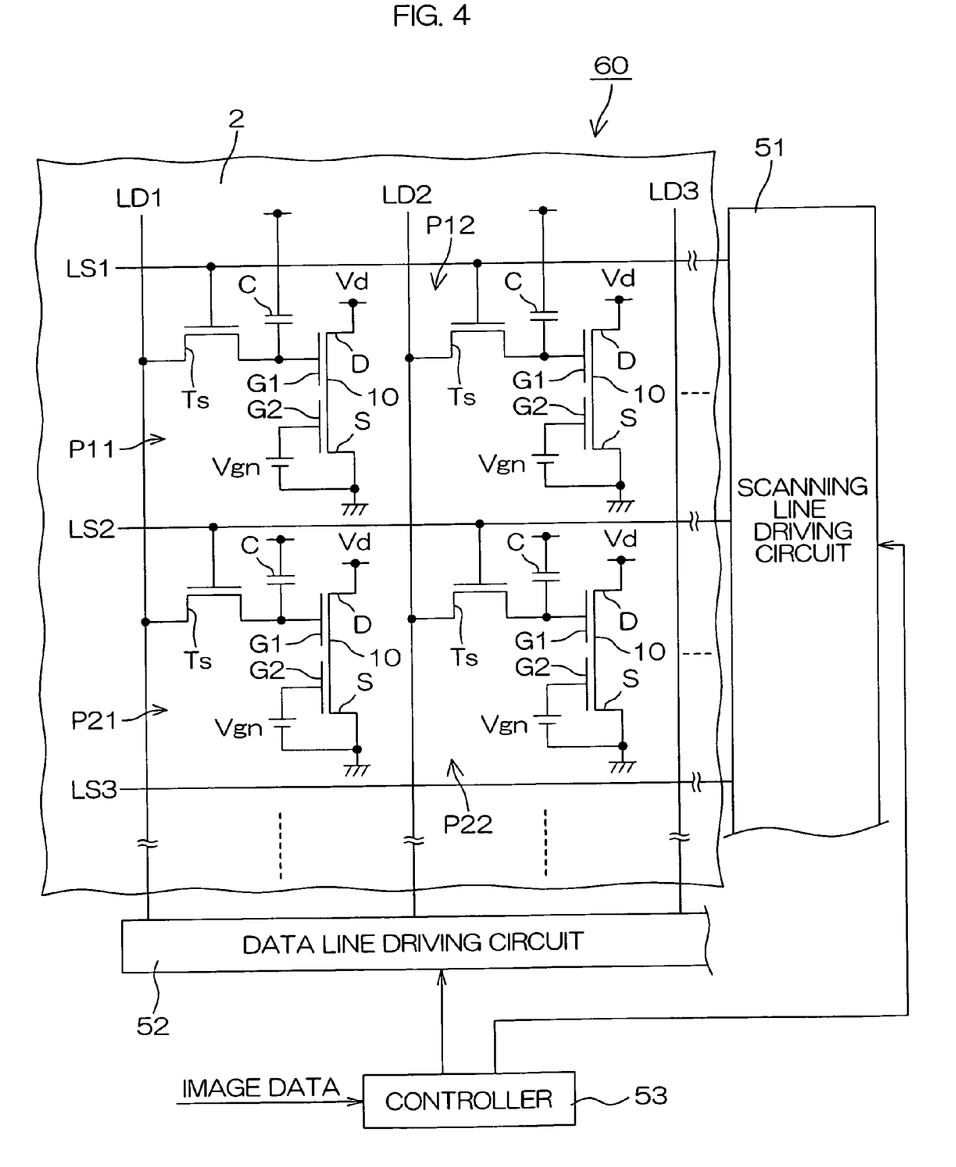
FIG. 4 is an electrical circuit diagram of a display device in which the organic semiconductor device shown in FIGS. 1, 2A, 2B or FIG. 3 are arranged two-dimensionally on a substrate.

FIG. 4 shows an electrical circuit diagram of a display device 60, in which the organic semiconductor devices 10, 10A or 10B shown in FIGS. 1, 2A, 2B or FIG. 3 (identified in general by the reference numeral 10 in FIG. 4) are arranged two-dimensionally on the substrate 2. More specifically, the display device 60 has the aforementioned organic semiconductor devices 10 respectively arranged in matrix-arrayed pixels P11, P12, ..., P21, P22, ..., and makes it possible to achieve two-dimensional display by selecting the organic semiconductor devices 10 that are to emit light in these pixels and by controlling light intensity (luminance) of the organic semiconductor devices 10 in these pixels.

Each organic semiconductor 10 is a field effect transistor (FET) having the hole-side gate electrode 5 and the electron-side gate electrode 6 as a pair of gates G1, G2. A bias voltage Vd is applied to the hole injecting electrode 8 as a drain. The electron injecting electrode 9 as a source is connected to a ground potential. To the gate G2, a constant control voltage $V_{gn}$ is applied, the value of which is determined so that it can pinch off the electron-side channel 16 at a midpoint between the hole injecting electrode 8 and the electron injecting electrode 9, for example. To the gate G1, a selective transistor $T_s$ for selecting each pixel and a capacitor C for storing data are connected in parallel.

The pixels P11, P12, ...; P21, P22 ... are aligned in rows. In these pixels, the selective transistors $T_s$ in each line have gates respectively connected as a group to their common scanning lines LS1, LS2, .... The pixels P11, P21 ...; P12, P22 ... are aligned in columns. In these pixels, in the opposite side of the organic semiconductor 10, the selective transistors $T_s$ have gates connected respectively to their common data lines D1, LD2, etc.

To scanning lines LS1, LS2, ..., a scan drive signal is given from a scanning line driving circuit 51 that is controlled by controller 53. The signal circulates pixels P11, P12, ...; P21, P22 ... in each row and sequentially selects a plurality of pixels in the row collectively. More specifically, the scanning line driving circuit 51 sequentially scans each line and determines which line to be conducted or blocked and generates scan drive signal. With the signal, the selective transistors $T_s$ in a plurality of pixels in a selected line are made conductive. The selective transistors $T_s$ in a plurality of pixels in a non-selected line are blocked.

On the other hand, to data lines LD1, LD2, ..., a signal is input from a data line driving circuit 52. To the data line driving circuit 52, a control signal corresponding to image data is input from a controller 53. The data line driving circuit 52 transmits a light emission control signal corresponding to gradation of light of each pixel in the selected lines to the data lines LD1, LD2, ..., in parallel, at the time when the scanning line driving circuit 51 selects a plurality of pixels in each line collectively.

Consequently, in each pixel of the selected lines, a light emission control signal is transferred to the gate G1 through the selective transistor $T_s$, allowing the organic semiconductor 10 of the selected pixel to emit light (or distinguish light) at gradation in accordance with the light emission control signal. Since the light emission control signal is preserved at the capacitor C, the electric potential of the gate G1 is preserved even after the lines selected by the scanning line driving circuit 51 moves to other lines, thus preserving the lighting state of the organic semiconductor device 10. In this manner two-dimensional display is enabled.

It should be noted that a similar operation can be performed when the light emission control signal is given to the gate G2 from the data lines LD1, LD2, ..., while fixing the volume of electric potential of the gate G1. Moreover, if the control voltage applied to the gates G1 and G2 is controlled individually in accordance with the image data, display with more gradation will be available.

Figure 5:
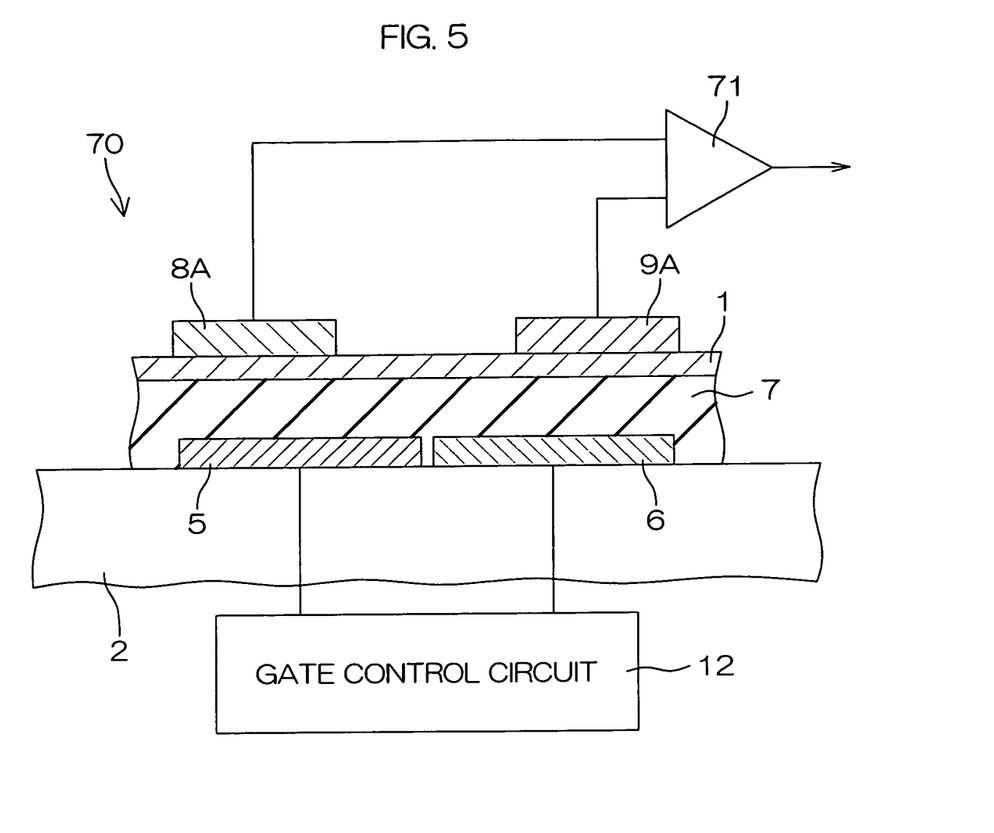
FIG. 5 is a schematic sectional view of an embodiment of a light sensor that is arranged with the organic semiconductor device of the present invention.

FIG. 5 is a schematic sectional view of an embodiment of a light sensor 70 that is arranged with the organic semiconductor device of the present invention. In FIG. 5, each element corresponding to the element shown in FIG. 1 will be given identical reference numerals in FIG. 1. In this embodiment, a positive electrode (P-electrode) 8A is arranged opposing to the hole-side gate electrode 5 on the organic semiconductor layer 1. Negative electrode (N-electrode) 9A is arranged opposing to the electron-side gate electrode 6 on the organic semiconductor layer 1. The organic semiconductor layer 1 is used in this embodiment as an organic semiconductor photosensitive layer that generates pairs of electrons and holes when exposed to externally illuminated light.

From the gate control circuit 12, a control voltage for guiding holes to the positive electrode 8A is applied to the hole-side gate electrode 5. At the same time, a control voltage for guiding electrons to the negative electrode 9A is applied to the electron-side gate electrode 6. Consequently, when the organic semiconductor layer 1 is exposed to light and generates pairs of electrons and holes, it directs holes to the positive electrode 8A and electrons to the negative electrode 9A, thus generating an electromotive force between the positive electrode 8A and the negative electrode 9A. The voltage generated between the positive electrode 8A and the negative electrode 9A is then amplified by an amplifier circuit 71 and extracted. This is a mechanism for detecting the amount of incident light that has entered to the organic semiconductor layer 1.

Instead of using the organic semiconductor layer 1, the organic semiconductor layer 1A or 1B shown in FIGS. 2A, 2B or FIG. 3 may be used to configure a similar light sensor 70.

Figure 6:
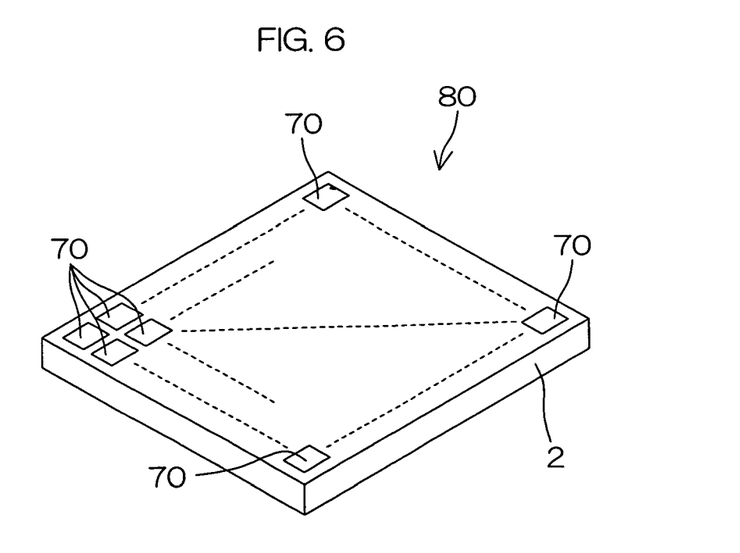
FIG. 6 is a schematic diagram showing an arrangement of an imager having the light sensors shown in FIG. 5 disposed in a matrix form on a substrate.

As shown in FIG. 6, the several light sensors 70 are arranged in matrix layouts as a detector pixel on the substrate 2 to configure an imager 80 for detecting a two-dimensional image.

Although the invention has been described with reference to the several embodiments hereinabove, it will be clear that further embodiments of the present invention may be implemented. For example, instead of using the two-dimensional display 60 shown in FIG. 4, a one-dimensional display, which arranges pixels in one-dimensional layout, may also be used. Similarly, instead of using the imager 80 shown in FIG. 6, which arranges detector pixels that utilize the light sensors 70 in two-dimensional layout, a one-dimensional imager, which arranges detector pixels in one-dimensional layout, may also be used.

Although the present invention has been described in considerable detail, the invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

The present application corresponds to Japanese Patent Application No. 2004-13529 filed to the Japan Patent Office on Jan. 21, 2004, the entire disclosures of which is incorporated herein by reference.

What is claimed is:

1. An organic semiconductor device, comprising:
a bipolar organic semiconductor layer in which electrons and holes are movable;
a hole giving/receiving electrode for giving/receiving holes to/from the organic semiconductor layer;
an electron giving/receiving electrode, spaced a predetermined distance from the hole giving/receiving electrode, for giving/receiving electrons to/from the organic semiconductor layer;
a hole-side gate electrode, arranged opposing a region of the organic semiconductor layer near the hole giving/receiving electrode with an insulating layer sandwiched, for controlling distribution of holes in the organic semiconductor layer; and
an electron-side gate electrode, arranged opposing a region of the organic semiconductor layer near the electron giving/receiving electrode with an insulating layer sandwiched, for controlling distribution of electrons in the organic semiconductor layer, wherein
the organic semiconductor layer is an organic semiconductor photo-sensitive layer that generates pairs of electrons and holes through external irradiation of light.

2. The organic semiconductor device according to claim 1, wherein the organic semiconductor layer is formed of a bipolar organic semiconductor material.

3. The organic semiconductor device according to claim 1, wherein the organic semiconductor layer includes a laminated structural film with an N-type organic semiconductor layer and a P-type organic semiconductor layer laminated with each other.

4. The organic semiconductor device according to claim 1, wherein the organic semiconductor layer has a junction film structure including an N-type organic semiconductor layer and a P-type organic semiconductor layer having a junction portion between the hole giving/receiving electrode layer and the electron giving/receiving electrode layer.

5. The organic semiconductor device according to claim 1, wherein the organic semiconductor layer is formed of a mixture of an N-type organic semiconductor material and a P-type organic semiconductor material.

6. An imager comprising a plurality of the organic semiconductor devices according to claim 1 arranged on a substrate.

* * * * *